US009778296B2

(12) United States Patent
Chang et al.

(10) Patent No.: US 9,778,296 B2
(45) Date of Patent: Oct. 3, 2017

(54) METHOD FOR OBTAINING PLUG COMBINATION OF DETECTING APPARATUS AND METHOD FOR OBTAINING POWER LINE TOPOLOGY AND ELECTRONIC APPARATUS USING THE SAME

(71) Applicant: National Chiao Tung University, Hsinchu (TW)

(72) Inventors: Wen-Hsin Chang, Hsinchu (TW); Yung-Chi Chen, Hsinchu (TW); Shiao-Li Tsao, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 448 days.

(21) Appl. No.: 14/582,197

(22) Filed: Dec. 24, 2014

(65) Prior Publication Data
US 2016/0047848 A1 Feb. 18, 2016

(30) Foreign Application Priority Data
Aug. 14, 2014 (TW) .............................. 103127954 A

(51) Int. Cl.
*G01R 21/133* (2006.01)
*G01R 19/25* (2006.01)

(52) U.S. Cl.
CPC ........ *G01R 21/133* (2013.01); *G01R 19/2513* (2013.01)

(58) Field of Classification Search
CPC .......................... G01R 19/2513; G01R 21/133
USPC ..... 702/61, 64, 71; 324/10, 76.12, 601, 713, 324/76.11, 110; 700/298
See application file for complete search history.

(56) References Cited

U.S. PATENT DOCUMENTS

| 4,858,141 | A | 8/1989 | Hart et al. |
| 5,276,629 | A | 1/1994 | Reynolds |
| 5,483,153 | A | 1/1996 | Leeb et al. |
| 5,717,325 | A | 2/1998 | Leeb et al. |

(Continued)

OTHER PUBLICATIONS

George W. Hart, "Nonintrusive appliance load monitoring," Proceedings of the IEEE, Dec. 1992, pp. 1870-1891.
Liang et al., "Load Signature Study—Part I: Basic Concept, Structure, and Methodology," IEEE Transactions on Power Delivery, Apr. 2010, pp. 551-560.
Liang et al., "Load Signature Study—Part II: Disaggregation Framework, Simulation, and Applications," IEEE Transactions on Power Delivery, Apr. 2010, pp. 561-569.

(Continued)

Primary Examiner — John H Le
(74) Attorney, Agent, or Firm — Jianq Chyun IP Office

(57) ABSTRACT

A method for obtaining plug combination of detecting apparatus, a method for obtaining power line topology and an electronic apparatus using the same are provided. The method for obtaining plug combination of detecting apparatus includes the following steps: retrieving a first amount of at least one detecting apparatus and a second amount of at least one socket; generating plug combinations between the at least one detecting apparatus and the at least one socket; calculating a total socket relationship value according to the second amount; setting specific plug times and a specific socket relationship value of a specific plug combination according to the first amount; and finding a candidate plug combination among reference plug combinations according to the specific socket relationship value, the total socket relationship value and a distance between the specific plug combination and each of the reference plug combinations.

19 Claims, 8 Drawing Sheets

(56) References Cited

U.S. PATENT DOCUMENTS

| | | | |
|---|---|---|---|
| 5,933,004 A * | 8/1999 | Jackson | G01R 22/065 324/110 |
| 6,515,485 B1 | 2/2003 | Bullock et al. | |
| 7,755,371 B2 | 7/2010 | Wells | |
| 7,885,917 B2 | 2/2011 | Kuhns et al. | |
| 8,463,452 B2 | 6/2013 | Masters et al. | |
| 2011/0004421 A1 | 1/2011 | Rosewell et al. | |
| 2013/0110621 A1 | 5/2013 | Gupta et al. | |
| 2013/0132423 A1 | 5/2013 | Tsao et al. | |
| 2013/0179124 A1 | 7/2013 | Patel et al. | |

OTHER PUBLICATIONS

Patel et al., "At the Flick of a Switch: Detecting and Classifying Unique Electrical Events on the Residential Power Line," Lecture Notes in Computer Science, Sep. 2007, pp. 271-288.

Gupta et al., "ElectriSense: single-point sensing using EMI for electrical event detection and classification in the home," Proceedings of the 12th ACM international conference on Ubiquitous computing, Sep. 2010, pp. 139-148.

Froehlich et al., "Disaggregated End-Use Energy Sensing for the Smart Grid," IEEE Pervasive Computing, Jan.-Mar. 2011, pp. 28-39.

Enev et al., "Televisions, video privacy, and powerline electromagnetic interference," Proceedings of the 18th ACM conference on Computer and communications security, Oct. 2011, pp. 537-550.

Cole et al., "Algorithm for nonintrusive identification of residential appliances," Proceedings of the 1998 IEEE International Symposium on Circuits and Systems, May-Jun. 1998, pp. III-338-III-341.

Cox et al., "Transient event detection for nonintrusive load monitoring and demand side management using voltage distortion," Twenty-First Annual IEEE Applied Power Electronics Conference and Exposition, Mar. 2006, pp. 1751-1757.

Wen-Hsin Chang, "Improving Nonintrusive Load Monitoring Technology based on Power-line Topology Information," Master thesis, Aug. 2013, Institute of Computer Science and Engineering, National Chiao Tung University.

* cited by examiner

| Plug Combinations \ Sockets | P1 | P2 | P3 | P4 | P5 | P6 |
|---|---|---|---|---|---|---|
| C1 | 1 | 1 | 1 | 0 | 0 | 0 |
| C2 | 1 | 1 | 0 | 1 | 0 | 0 |
| C3 | 1 | 1 | 0 | 0 | 1 | 0 |
| C4 | 1 | 1 | 0 | 0 | 0 | 1 |
| C5 | 1 | 0 | 1 | 1 | 0 | 0 |
| C6 | 1 | 0 | 1 | 0 | 1 | 0 |
| C7 | 1 | 0 | 1 | 0 | 0 | 1 |
| C8 | 1 | 0 | 0 | 1 | 1 | 0 |
| C9 | 1 | 0 | 0 | 1 | 0 | 1 |
| C10 | 1 | 0 | 0 | 0 | 1 | 1 |
| C11 | 0 | 1 | 1 | 1 | 0 | 0 |
| C12 | 0 | 1 | 1 | 0 | 1 | 0 |
| C13 | 0 | 1 | 1 | 0 | 0 | 1 |
| C14 | 0 | 1 | 0 | 1 | 1 | 0 |
| C15 | 0 | 1 | 0 | 1 | 0 | 1 |
| C16 | 0 | 1 | 0 | 0 | 1 | 1 |
| C17 | 0 | 0 | 1 | 1 | 1 | 0 |
| C18 | 0 | 0 | 1 | 1 | 0 | 1 |
| C19 | 0 | 0 | 1 | 0 | 1 | 1 |
| C20 | 0 | 0 | 1 | 0 | 1 | 1 |

FIG. 3

| Plug Combinations \ Sockets | P1 | P2 | P3 | P4 | P5 | P6 | Socket Relationship Value | Number of Plugging Actions |
|---|---|---|---|---|---|---|---|---|
| C1  | 1 | 1 | 1 | 0 | 0 | 0 | 3 | 3 |
| C13 | 0 | 1 | 1 | 0 | 0 | 1 | 2 | 2 |
| C17 | 0 | 0 | 1 | 1 | 1 | 0 | 3 | 4 |
| C14 | 0 | 1 | 0 | 1 | 1 | 0 | 2 | 2 |
| C10 | 1 | 0 | 0 | 0 | 1 | 1 | 3 | 4 |
| C9  | 1 | 0 | 0 | 1 | 0 | 1 | 2 | 2 |
|     |   |   |   |   |   |   | ⑮ | ⑰ |

METHOD FOR OBTAINING PLUG COMBINATION OF DETECTING APPARATUS AND METHOD FOR OBTAINING POWER LINE TOPOLOGY AND ELECTRONIC APPARATUS USING THE SAME

CROSS-REFERENCE TO RELATED APPLICATION

This application claims the priority benefit of Taiwan application serial no. 103127954, filed on Aug. 14, 2014. The entirety of the above-mentioned patent application is hereby incorporated by reference herein and made a part of this specification.

BACKGROUND OF THE INVENTION

1. Field of the Invention

The invention relates to a method for obtaining plug combination of detecting apparatus and an electronic using the same, and also relates a method for obtaining power line topology.

2. Description of Related Art

A traditional electric meter/smart electric meter is usually an information closed system configured to provide household or enterprise a bill from last month or counted within a period of time, such that users can know how much electricity has been used only after receiving the bill. The smart electric meter can display real-time power consumption information of household or enterprise but cannot inform power consumption information of individual appliance to the users. In the absence of the power consumption information of the appliances, the smart electric meter cannot effectively confine or be aware of power-consuming appliances and inform the user about causes of the power consumption, and thus the users are unable to improve or manage the power consumption.

In the Nonintrusive Load Monitoring (NILM) technology, one single electric meter is used to monitor changes in power signal signatures (e.g., a total voltage and a total current in a power loop), so as to identify the appliance currently power usage and states thereof. In comparison with a power consumption monitoring apparatus that installs the smart electric meter on each socket, the NILM technology is capable of significantly reducing installation costs to be more acceptable for the users.

The NILM technology can be used to understand usage states of the appliances. In previous approaches, various appliance load signatures are collected in advance and served as training data, so that the usage states of the appliances can be identified later by using different detecting methods proposed by researchers. However, in actual environments, the usage states of the appliances can change due to inconsistent quality of power supply, resulting that the detected usage states of the appliances being different from the appliance load signatures previously collected and trained. Aforesaid situation can generate errors in the identification, which are challenges to be faced in implementation of the NILM technology.

For instance, in addition to a source of the power supply, the quality of power supply is also highly correlated to a location of each socket in space and a distance between power lines thereof. When a distance between the socket and the electric meter is shorter, an output voltage of the socket is less likely to offset too much from a voltage provided by an electric power company due to attenuation generated by a power transmission line. However, when the distance between the socket and the electric meter is longer, the output voltage of the socket may be offset too much from the voltage provided by the electric power company, such that the power signal signatures generated by the appliance plugged on the socket and measured by the electric meter can exhibit greater attenuation due to a length of the power transmission line being longer. Therefore, if a power line topology structure between the electric meter and each socket can be accurately obtained, the NILM technology will be capable of further improving accuracy in the identification of the appliances.

The users may measure power information of each socket by a method of connecting one or more detecting apparatuses one by one to each socket, such that the power line topology structure can be deduced by integrating the power information. However, this method has lower efficiency which leads to increases in costs. Specifically, in order to deduce the power line topology structure, in addition to measurement of impedance between a socket and a general supply (e.g., a power distribution line from the electric power company), it is also required to measure a socket relationship between the sockets (e.g., a differences between voltage values of the sockets and a sequential relationship thereof), so as to correctly identify whether the power transmission line between the sockets corresponding to the same power line topology structure is a structure in cascade link or in branch link.

For instance, when only one detecting apparatus is provided, the users need to connect the detecting apparatus with the sockets one by one in order to measure the power information of each socket. In a condition where the socket relationship between the sockets is to be measured, it is difficult to perform such measurement by using one single detecting apparatus.

Further, even if a plurality of detecting apparatuses are provided, if all of plug combinations between the detecting apparatuses and the sockets are only tested randomly without properly arranging a sequence of the plug combinations between the detecting apparatuses and the sockets, an efficiency of the entire measurement would be decreased. Moreover, if there is a large amount of the sockets corresponding to the same power line topology structure, the sequence of possible plug combinations will be increased accordingly to further reduce the efficiency of the entire measurement.

SUMMARY OF THE INVENTION

Accordingly, the invention is directed to a method for obtaining plug combination of detecting apparatus and an electronic apparatus using the same, which are capable of properly arranging a plug combination sequence between detecting apparatus and sockets, so as to improve efficiency of entire measuring process. Further, the invention is also directed to a method for obtaining power line topology in terms of node relationships, and capable of deducing power topology relationships of the sockets based on the measured power information.

The invention provides a method for obtaining plug combination of detecting apparatus, which is adapted to an electronic apparatus. The method includes the following steps: retrieving a first amount of at least one detecting apparatus and a second amount of at least one socket; generating a plurality of plug combinations between the at least one detecting apparatus and the at least one socket, wherein each of the plug combinations is corresponding to a pairing result of the at least one detecting apparatus and the at least one socket, and the plug combinations include a specific plug combination and a plurality of reference plug combinations; calculating a total socket relationship value according to the second amount; setting specific plug times and a specific socket relationship value of a specific plug combination according to the first amount; and finding a candidate plug combination from the reference plug combinations according to the specific socket relationship value, the total socket relationship value and a distance between the specific plug combination and each of the reference plug combinations.

In an embodiment of the invention, the step of calculating the total socket relationship value according to the second amount includes: calculating the total socket relationship value by using $C_2^N$, wherein N is the second amount.

In an embodiment of the invention, the step of setting the specific plug times and the specific socket relationship value of the specific plug combination according to the first amount includes: setting the specific plug times to be the first amount; and calculating the specific socket relationship value by using $C_2^M$, wherein M is the first amount (M is a positive integer).

In an embodiment of the invention, the step of finding the candidate plug combination from the reference plug combinations according to the specific socket relationship value, the total socket relationship value and the distance between the specific plug combination and each of the reference plug combinations includes: calculating a plurality of scores corresponding to the reference plug combinations; finding a highest score among the scores; and defining the reference plug combination corresponding to the highest score to be the candidate plug combination.

In an embodiment of the invention, the distance is a Hamming distance, a $k^{th}$ reference plug combination among the reference plug combinations is corresponding to a $k^{th}$ score among the scores, and the step of calculating the scores corresponding to the reference plug combinations includes: representing the $k^{th}$ score as:

$$Score_k = \frac{R_k}{R_{total}} + \frac{1}{NumBit(x_n \oplus x_k)}$$

Among them, $Score_k$ is the $k^{th}$ score, $R_k$ is a socket relationship value between the specific plug combination and the $k^{th}$ reference plug combination, $R_{total}$ is the total socket relationship value, $x_n$ is the specific plug combination, $x_k$ is the $k^{th}$ reference plug combination, $NumBit(x_n \oplus x_k)$ is the Hamming distance between $x_n$ and $x_k$, and $\oplus$ is an exclusive OR operator.

In an embodiment of the invention, after the step of finding the candidate plug combination from the reference plug combinations according to the specific socket relationship value, the total socket relationship value and the distance between the specific plug combination and each of the reference plug combinations, the method further includes: adding the specific plug combination to a plug combination sequence list; accumulating the specific socket relationship value to a count value; eliminating the candidate plug combination from the reference plug combinations when the count value is less than the total socket relationship value; updating the specific socket relationship value according to the socket relationship value between the candidate plug combination and the specific plug combination, and setting the candidate plug combination to be the specific plug combination; and finding again the candidate plug combination among the reference plug combinations according to the specific socket relationship value, the total socket relationship value and the distance between the specific plug combination and each of the reference plug combinations.

In an embodiment of the invention, the plug combination sequence list is outputted when the count value is not less than the total socket relationship value.

The invention provides an electronic apparatus which includes a storage unit and a processing unit. The storage unit is configured to store a plurality of modules. The processing unit is coupled to the storage unit to access and execute the modules recorded in the storage unit. The modules include a retrieving module, a generating module, a calculating module, a setting module and a first finding module. The retrieving module retrieves a first amount of at least one detecting apparatus and a second amount of at least one socket. The generating module generates a plurality of plug combinations between the at least one detecting apparatus and the at least one socket, Each of the plug combinations is corresponding to a pairing result of the at least one detecting apparatus and the at least one socket, and the plug combinations include a specific plug combination and a plurality of reference plug combinations. The calculating module calculates a total socket relationship value according to the second amount. The setting module sets specific plug times and a specific socket relationship value of the specific plug combination according to the first amount. The first finding module finds a candidate plug combination among the reference plug combinations according to the specific socket relationship value, the total socket relationship value and a distance between the specific plug combination and each of the reference plug combinations.

In an embodiment of the invention, the calculating module calculates the total socket relationship value by using $C_2^N$, wherein N is the second amount.

In an embodiment of the invention, the setting module is configured to set the specific plug times to be the first amount; and calculate the specific socket relationship value by using $C_2^M$, wherein M is the first amount.

In an embodiment of the invention, the first finding module is configured to calculate a plurality of scores corresponding to the reference plug combinations; find a highest score among the scores; and define the reference plug combination corresponding to the highest score to be the candidate plug combination.

In an embodiment of the invention, the distance is a Hamming distance, and the first finding module represents the $k^{th}$ score as:

$$Score_k = \frac{R_k}{R_{total}} + \frac{1}{NumBit(x_n \oplus x_k)}$$

Among them, $Score_k$ is the $k^{th}$ score, $R_k$ is a socket relationship value between the specific plug combination and the $k^{th}$ reference plug combination, $R_{total}$ is the total socket relationship value, $x_n$ is the specific plug combination, $x_k$ is the $k^{th}$ reference plug combination, $NumBit(x_n \oplus x_k)$ is the Hamming distance between $x_n$ and $x_k$ and $\oplus$ is an exclusive OR operator.

In an embodiment of the invention, the modules further include a second finding module, which is configured to add the specific plug combination to a plug combination sequence list; accumulate the specific socket relationship value to a count value; eliminate the candidate plug combination from the reference plug combinations when the count value is less than the total socket relationship value; update the specific socket relationship value according to the socket relationship value between the candidate plug combination and the specific plug combination, and set the candidate plug combination to be the specific plug combination; and find again the candidate plug combination among the reference plug combinations according to the specific socket relationship value, the total socket relationship value and the distance between the specific plug combination and each of the reference plug combinations.

In an embodiment of the invention, the second finding module outputs the plug combination sequence list when the count value is not less than the total socket relationship value.

The invention provides a method for obtaining power line topology, which is adapted to at least two detecting apparatuses, and includes the following. A first detecting apparatus and a second detecting apparatus among the at least two detecting apparatuses are connected to a first socket and a second socket among a plurality of sockets respectively. The sockets belong to the same space. In a first condition where a first load of the first detecting apparatus is enabled and a second load of the second detecting apparatus is disabled, a first voltage of the first socket is measured by the first detecting apparatus, and a second voltage of the second socket is measured by the second detecting apparatus. In a second condition where the first load of the first detecting apparatus is disabled and the second load of the second detecting apparatus is enabled, a third voltage of the first socket is measured by the first detecting apparatus, and a fourth voltage of the second socket is measured by the second detecting apparatus. A connecting relationship between the first socket and the second socket is determined according to the first voltage, the second voltage, the third voltage and the fourth voltage.

In an embodiment of the invention, the step of determining the connecting relationship between the first socket and the second socket according to the first voltage, the second voltage, the third voltage and the fourth voltage includes: determining whether the first voltage is higher than the second voltage. If the first voltage is not higher than the second voltage, determining whether the third voltage is higher than the fourth voltage; if yes, determining that the first socket is connected to the second socket in branch link; and if no, determining that the first socket is connected to the second socket in cascade link. If the first voltage is higher than the second voltage, determining whether the third voltage is lower than the fourth voltage; if yes, determining that the first socket is connected to the second socket in branch link; and if no, determining that the first socket is connected to the second socket in cascade link.

In an embodiment of the invention, after the step of determining the connecting relationship between the first socket and the second socket according to the first voltage, the second voltage, the third voltage and the fourth voltage, the method further includes: establishing a measured matrix based on a cascade relationship between each of the sockets, and simplifying the measured matrix to establish a power line topology corresponding to the sockets.

In an embodiment of the invention, the measured matrix is:

$$\begin{bmatrix} p_{1,1} & p_{1,2} & \cdots & p_{1,L} \\ p_{2,1} & & & \\ \vdots & & \ddots & \vdots \\ p_{L,1} & & \cdots & p_{L,L} \end{bmatrix}$$

Among them, L is an amount of the sockets. When the $i^{th}$ socket among the sockets is not connected to the $j^{th}$ socket in cascade link, $p_{i,j}$ is 1. When the $i^{th}$ socket among the sockets is not connected to the $j^{th}$ socket in cascade link, $p_{i,j}$ is 0.

In an embodiment of the invention, the step of simplifying the measured matrix to establish the power line topology corresponding to the sockets includes: executing a triangle cycle elimination method to simplify the measured matrix.

Based on above, the method for obtaining plug combination of detecting apparatus and the electronic apparatus thereof proposed by the invention are capable of finding the candidate plug combination capable of minimizing the plug times and maximizing the socket relationships from among the reference plug combinations after the specific plug combination is determined.

Moreover, based on the power information of the sockets measured by the detecting apparatuses according to the plug combination sequence list, the method for obtaining power line topology proposed by the invention is capable of correspondingly finding the cascade relationship between each of the sockets and thereby deducing the power line topology corresponding to the sockets.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3 is a schematic diagram illustrating a plurality of plug combinations according to an embodiment of the invention.

FIG. 5 is a schematic diagram illustrating a plug combination sequence list according to the embodiment of FIG. 3.

DESCRIPTION OF THE EMBODIMENTS

Figure 1:
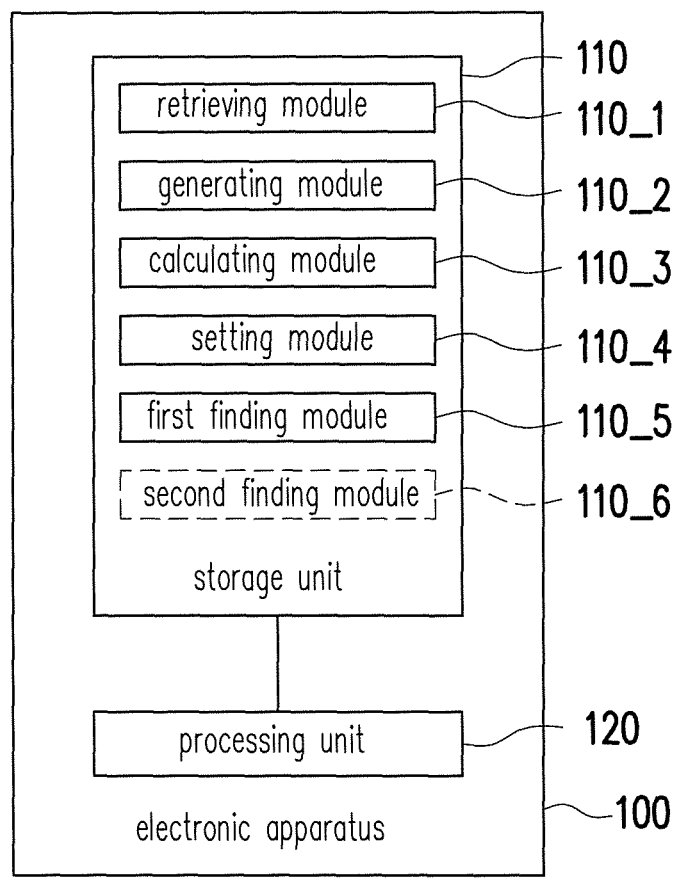
FIG. 1 is a functional block diagram illustrating an electronic apparatus according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a functional block diagram illustrating an electronic apparatus according to an embodiment of the invention. In the present embodiment, an electronic apparatus 100 includes a storage unit 110 and a processing unit 120. The electronic apparatus 100 is, for example, a smart phone, a tablet computer, a personal digital assistant (PDA), a personal computer (PC), a notebook computer, a work station or other similar apparatuses. The electronic apparatus 100 includes the storage unit 110 and the processing unit 120. The storing unit 110 is, for example, a memory, a hard disk or other devices capable of storing data for recording a plurality of modules.

The processing unit 120 is coupled to the storage unit 110. The processing unit 120 can be a processor for general purposes, a processor for special purposes, a conventional processor, a data signal processor, a plurality of microprocessors, one or more microprocessors, controllers, microcontrollers and Application Specific Integrated Circuit (ASIC) which are combined to a core of the digital signal processor, a Field Programmable Gate Array (FPGA), any other integrated circuits, a state machine, a processor based on Advanced RISC Machine (ARM) and similar products.

In the present embodiment, the processing unit 120 can access a retrieving module 110_1, a generating module 110_2, a calculating module 110_3, a setting module 110_4 and a first finding module 110_5 stored by the storage unit 110 in order to execute each step of the method for obtaining plug combination of detecting apparatus proposed by the invention.

Figure 2:
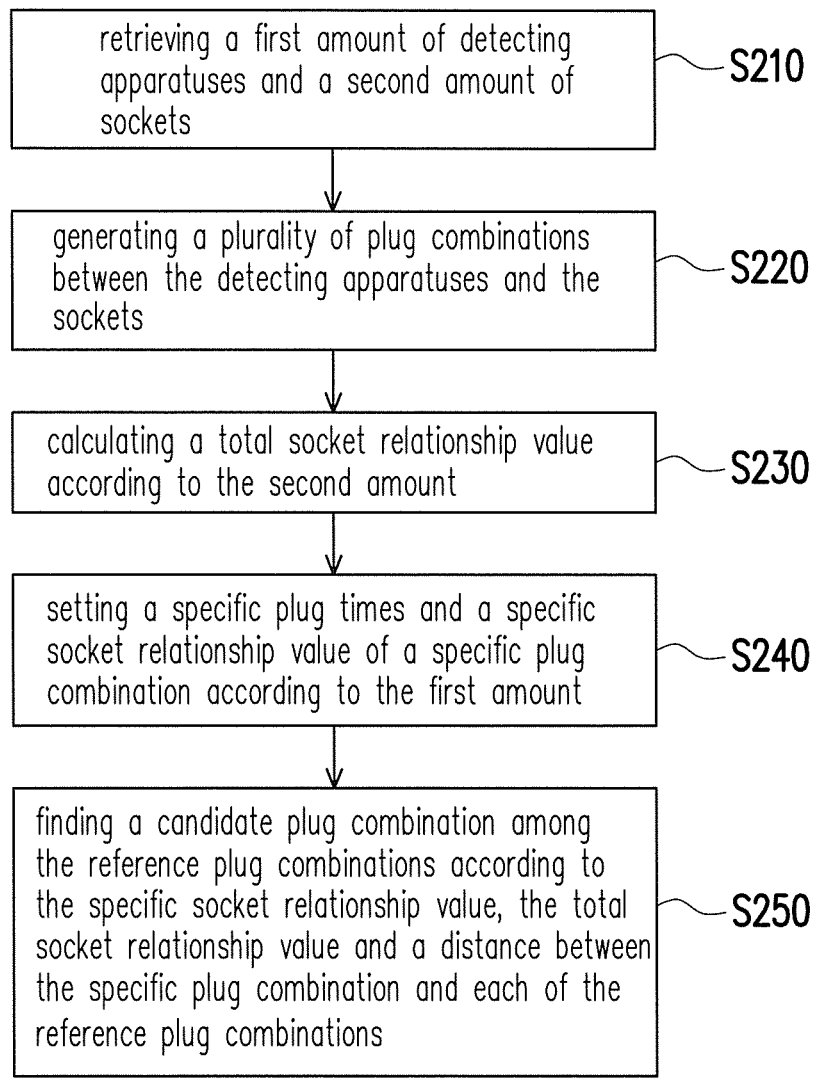
FIG. 2 illustrates a method for obtaining plug combination of detecting apparatus according to an embodiment of the invention.

FIG. 2 illustrates a method for obtaining plug combination of detecting apparatus according to an embodiment of the invention. The method proposed by the present embodiment can be executed by the electronic apparatus 100 depicted in FIG. 1, and each steps of the present embodiment is described in detail with reference to each element depicted in FIG. 1.

In step S210, the retrieving module 110_1 retrieves a first amount of detecting apparatuses and a second amount of sockets. In an embodiment, the first amount and the second amount can be inputted into the electronic apparatus 100 by a user through a user interface such as a keyboard or a touch screen of the electronic apparatus 100 (not illustrated).

It should be understood that, each of the sockets taken in consideration by the present embodiment refers to each of sockets belonging to the same power line topology structure within the same space. For instance, each of the sockets can be each of sockets within the same space (e.g., home, company, office and/or room). More specifically, each of sockets taken in consideration by the present embodiment is each of sockets monitored by the same electric meter (which adopts the NILM technology), but possible embodiments of the invention are not limited thereto.

The detecting apparatus is, for example, an apparatus having elements such as a switch, a voltage sensor, a load and a plug. When the user connects the detecting apparatus to the socket, the detecting apparatus can be used to find an impedance value of a power line between the socket and a power supply (e.g., a power distribution line from the electric power company).

Subsequently, in step S220, the generating module 110_2 generates a plurality of plug combinations between the detecting apparatuses and the sockets. In the present embodiment, each of the plug combinations is corresponding to a pairing result of the detecting apparatus and the socket. Further, the plug combinations include a specific plug combination and a plurality of reference plug combinations. The specific plug combination is, for example, any plug combination among the plug combinations, and the reference plug combinations are, for example, the plug combinations other than the specific plug combination.

Take FIG. 3 for example, which is a schematic diagram illustrating a plurality of plug combinations according to an embodiment of the invention. In the present embodiment, it is assumed that the first amount of the detecting apparatuses is 3; and it is also assumed that the second amount of the sockets is 6 and sockets P1 to P6 are used to distinguish between these 6 sockets.

In an embodiment, based on simple concept of permutation and combination, the generating module 110_2 is capable of generating 20 (i.e., $C_3^6$) possible plug combinations C1 to C20 (i.e., the pairing results) for the 3 detecting apparatuses and the 6 sockets.

As mentioned previously, each of the plug combinations C1 to C20 is corresponding to one pairing result of the detecting apparatus and the socket. In each of the plug combinations C1 to C20, the number "1" represents that one of the detecting apparatuses is connected to the corresponding socket; whereas the number "0" represents that none of the detecting apparatus is connected to the corresponding socket.

Take the plug combination C1 for example, which represents the pairing result in which 3 detecting apparatuses are connected to the sockets P1 to P3 respectively without connecting to the sockets P4 to P6. Further, take the plug combination C2 as another example, which represents the pairing result in which 3 detecting apparatuses are connected to the sockets P1, P2 and P3 respectively without connecting to the sockets P3, P5 and P6.

In an embodiment, the generating module 110_2 can arbitrarily select one of the plug combinations C1 to C20 to serve as the specific plug combination while regarding the rest of the plug combinations as the reference plug combinations. For instance, when the plug combination C1 is selected by the generating module 110_2 to serve as the specific plug combination, the generating module 110_2 can regard the plug combinations C2 to C20 as the reference plug combinations. As another example, when the plug combination C20 is selected by the generating module 110_2 to serve as the specific plug combination, the generating module 110_2 can regard the plug combinations C1 to C19 as the reference plug combinations. However, possible embodiments of the invention are not limited thereto. In order to describe concepts of the invention more clearly, it is assumed that the plug combination C1 is the specific plug combination in the following description.

The specific plug combination can be regarded as an initial plug combination, and the processing unit 120 can find a candidate plug combination capable of minimizing plug times and maximizing socket relationships among the reference plug combinations based on the initial plug combination, so that the user is able to complete actions for measuring the required power information of the sockets with best efficiency. Detailed description will be described hereinafter.

Referring to back to FIG. 2, in step S230, the calculating module 110_3 calculates a total socket relationship value according to the second amount. The total socket relationship value is, for example, an amount of all possible combinations between any two of the sockets.

In an embodiment, the calculating module 110_3 can calculate the total socket relationship value by using $C_2^N$, where N is the second amount (N is a positive integer). Take FIG. 3 for example, in a condition where the second amount of the sockets P1 to P6 is 6, the corresponding total socket relationship value thereof is, for example, 15 (i.e., $C_2^6$).

In step S240, the setting module 110_4 sets specific plug times and a specific socket relationship value of the specific plug combination according to the first amount. Specifically, the setting module 110_4 can set the specific plug times to be the first amount, and calculate the specific socket relationship value by using $C_2^M$ (M is the first amount).

Referring back to FIG. 3, it is assumed that the plug combination C1 is selected to be the specific plug combination. In this case, the setting module 110_4 can set the specific plug times to be 3 (i.e., the first amount of the detecting apparatuses). Specifically, the specific plug times represent a number of times for executing plugging actions by the user who intends to configure a pairing relationship between the detecting apparatus and the socket to be the specific plug combination. Take the plug combination C1 for example, if the user intends to configure the pairing relationship between the detecting apparatus and the socket to be the plug combination C1, the user is required to connect 3 detecting apparatuses to the sockets P1 to P3 respectively. That is, the user is required to execute the plugging action for 3 times in order to complete the configuration of the plug combination C1. From another perspective, since the specific plug combination can be regarded as the initial plug combination, the number of times for executing the corresponding plugging actions is definitely equal to the first amount of the detecting apparatuses.

The specific socket relationship value is, for example, an amount of the socket relationships between the sockets that can be obtained under the configuration of the specific plug combination. Again, take the plug combination C1 for example, in the case of such pairing result, the setting module 110_4 can obtain $C_2^3$ sets of the socket relationships (i.e., the socket relationship between the sockets P1 and P2, the socket relationship between the sockets P1 and P3 and the socket relationship between the sockets P2 and P3).

Subsequently, in step S250, the first finding module 110_5 finds the candidate plug combination among the reference plug combinations according to the specific socket relationship value, the total socket relationship value and a distance between the specific plug combination and each of the reference plug combinations. For example, the distance can be a Hamming distance.

In an embodiment, the first finding module 110_5 can calculate a plurality of scores corresponding to the reference plug combinations. Assuming that a $k^{th}$ (k is a positive integer) reference plug combination among the reference plug combinations is corresponding to a $k^{th}$ score among the scores, the first finding module 110_5 can represent the $k^{th}$ score as $$Score_k = \frac{R_k}{R_{total}} + \frac{1}{NumBit(x_n \oplus x_k)},$$

where $Score_k$ is the $k^{th}$ score, $R_k$ is a socket relationship value between the specific plug combination and the $k^{th}$ reference plug combination, $R_{total}$ is the total socket relationship value, $x_n$ is the specific plug combination, $x_k$ is the $k^{th}$ reference plug combination, $NumBit(x_n \oplus x_k)$ is the Hamming distance between $x_n$ and $x_k$, and $\oplus$ is an exclusive OR operator.

It should noted that, $R_k$ represents a new amount of the socket relationships which can be obtained after changing the specific plug combination to be the $k^{th}$ reference plug combination.

Take the plug combination C2 for example, on the premise that the plug combination C1 is the specific plug combination, $R_k$ corresponding to the plug combination C2 is 2. Specifically, although the socket relationship between the sockets P1 and P2, the socket relationship between the sockets P1 and P4 and the socket relationship between the sockets P2 and P4 can be obtained under the configuration of the plug combination C2, the socket relationship between the sockets P1 and P2 can already be obtained from the plug combination C1. Therefore, the new amount of the socket relationships obtained by changing the plug combination C1 to the plug combination C2 is actually 2 (i.e., the socket relationship between the sockets P1 and P4 and the socket relationship between the sockets P2 and P4). As mentioned previously, under the configuration shown in FIG. 3, the corresponding total socket relationship value thereof ($R_{total}$) is 15 (i.e., $C_2^6$).

In addition, the Hamming distance between the plug combinations C1 and C2 is 2 (i.e., $NumBit(x_n \oplus x_k)$). From another perspective, the Hamming distance can be regarded as the number of times for executing the plugging actions (i.e., 2 times) required when changing the plug combination C1 to the plug combination C2. Specifically, when the plug combination C1 is changed to the plug combination C2, the user must remove the detecting apparatus from the socket P3 (i.e., the first plugging action), and connect that detecting apparatus to the socket P4 (i.e., the second plugging action). Accordingly, the first finding module 110_5 can represent the score corresponding to the plug combination C2 as $$\left(\frac{2}{15} + \frac{1}{2}\right).$$

Further, take the plug combination C3 as another example, on the premise that the plug combination C1 is the specific plug combination, $R_k$ corresponding to the plug combination C3 is 2. Specifically, although the socket relationship between the sockets P1 and P2, the socket relationship between the sockets P1 and P5 and the socket relationship between the sockets P2 and P5 can be obtained under the configuration of the plug combination C3, the socket relationship between the sockets P1 and P2 can already be obtained from the plug combination C1. Therefore, the new amount of the socket relationships obtained by changing the plug combination C1 to the plug combination C3 is actually 2 (i.e., the socket relationship between the sockets P1 and P5 and the socket relationship between the sockets P2 and P5). As mentioned previously, under the configuration shown in FIG. 3, the corresponding total socket relationship value thereof ($R_{total}$) is 15 (i.e., $C_2^6$).

In addition, the Hamming distance between the plug combinations C1 and C3 is 2 (i.e., $NumBit(x_n \oplus x_k)$). From another perspective, the Hamming distance can be regarded as the number of times for executing the plugging actions (i.e., 2 times) required when changing the plug combination C1 to the plug combination C3. Specifically, when the plug combination C1 is changed to the plug combination C3, the user must remove the detecting apparatus from the socket P3 (i.e., the first plugging action), and connect that detecting apparatus to the socket P5 (i.e., the second plugging action). Accordingly, the first finding module 110_5 can represent the score corresponding to the plug combination C2 as $$\left(\frac{2}{15}+\frac{1}{2}\right).$$

Based on the teachings as described above, the first finding module 110_5 can correspondingly calculate the scores of the plug combinations C4 to C20. Subsequently, the first finding module 110_5 can find a highest score among the scores, and define the reference plug combination corresponding to the highest score to be the candidate plug combination.

Again, take FIG. 3 for example, the plug combination C13 is, for example, the plug combination corresponding to the highest score, such that the first finding module 110_5 can define the plug combination C13 to be the candidate plug combination.

Accordingly, the user can easily know that the plug times can be minimized and the socket relationships can be maximized by changing the specific plug combination to be the candidate plug combination. That is, after the candidate plug combination is found by the first finding module 110_5, the user is able to retrieve the largest number of the socket relationships with the least plug times.

In other embodiment, the storage unit 110 can further include a second finding module 110_6 capable of further finding other candidate plug combinations by ways of recursive fashion in the condition where the candidate plug combination is regarded as the specific plug combination. Subsequently, the second finding module 110_6 can integrate the found candidate plug combinations as a plug combination sequence list for the user to know how to arrange a plug combination sequence between the detecting apparatuses and the sockets, so as to retrieve the power information sufficient for deducing the power line topology structure with the highest efficiency.

Figure 4:
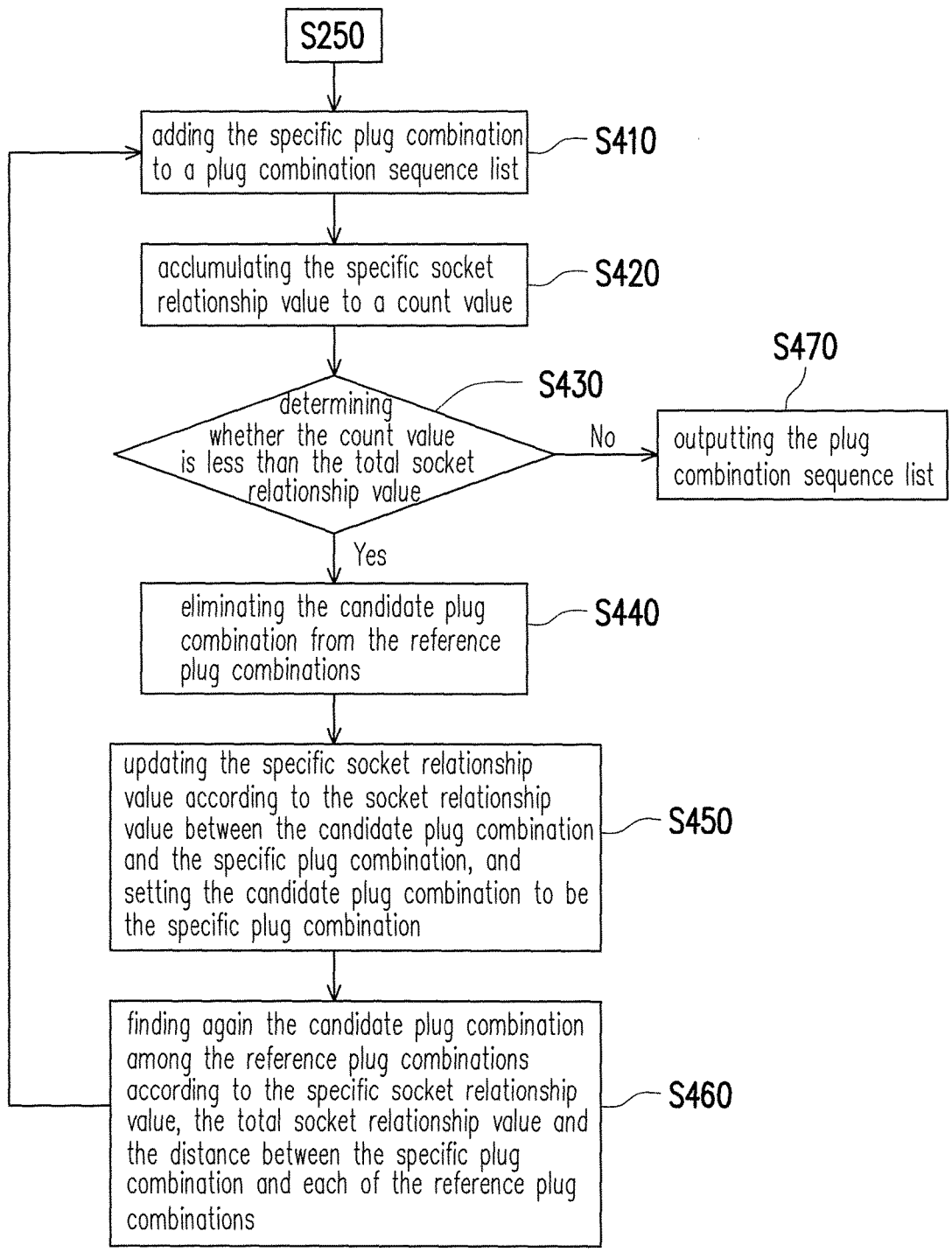
FIG. 4 illustrates the method for obtaining plug combination of detecting apparatus according to the embodiment of FIG. 2.

Referring to FIG. 4, which illustrates the method for obtaining plug combination of detecting apparatus according to the embodiment of FIG. 2. The method proposed by the present embodiment can be executed by the electronic apparatus 100 depicted in FIG. 1, and each steps of the present embodiment is described in detail with reference to each element depicted in FIG. 1.

In the present embodiment, after step S250, the second finding module 1106 can execute step S410 to add the specific plug combination to the plug combination sequence list. According to the assumptions in the previous embodiments, the second finding module 110_6 can record the plug combination C1 (i.e., the specific plug combination) into the plug combination sequence list.

Subsequently, in step S420, the second finding module 110_6 accumulates the specific socket relationship value to a count value. The count value can be initialized to be, for example, 0. According to the assumptions in the previous embodiments, the specific socket relationship value is 3, such that the second finding module 110_6 can obtain the count value being 3.

In step S430, the second finding module 110_6 determines whether the count value is less than the total socket relationship value. If yes, proceeding to step S470; and if no, proceeding to step S440.

In step S470, the second finding module 110_6 outputs the plug combination sequence list. Specifically, when the count value is not less than the total socket relationship value, it indicates that the plug combinations included in the plug combination sequence list can already be used to retrieve the power information sufficient for deducing the power line topology structure. Accordingly, the second finding module can provide the plug combination sequence list to the user, so that the user is able to adjust a pairing manner between the detecting apparatuses and the sockets accordingly.

On the other hand, when the count value is less than the total socket relationship value, it indicates that the plug combinations included in the plug combination sequence list cannot be used to retrieve the sufficient power information. Accordingly, the second finding module 110_6 can proceed to execute other steps.

In step S440, the second finding module 110_6 eliminates the candidate plug combination from the reference plug combinations. According to the assumptions in the previous embodiments, the second finding module 1106 can eliminate the plug combination C13 (i.e., the candidate plug combination) from the plug combinations C2 to C20.

Subsequently, in step S450, the second finding module 110_6 updates the specific socket relationship value according to the socket relationship value between the candidate plug combination and the specific plug combination, and sets the candidate plug combination to be the specific plug combination. In an embodiment, the second finding module 1106 can set the specific socket relationship value (i.e., 3) to be the socket relationship value between the candidate plug combination and the specific socket relationship value (i.e., 2). Further, the second finding module 1106 can change the specific plug combination from plug combination C1 to the plug combination C13.

Thereafter, in step S460, the second finding module 110_6 finds again the candidate plug combination among the reference plug combinations according to the specific socket relationship value, the total socket relationship value and the distance between the specific plug combination and each of the reference plug combinations. That is, the second finding module 110_6 can select another candidate plug combination from the plug combinations C2 to C12 and C14 to C20 on the premise that the specific plug combination is the plug combination C13. Implementation details of step S460 may refer to the related descriptions of step S250, which are not repeated hereinafter.

After step S460, the second finding module 110_6 can go back to step S410 and repeatedly execute steps S410 to S430 until the count value is not less than the total socket relationship value.

Referring to FIG. 5, which is a schematic diagram illustrating a plug combination sequence list according to the embodiment of FIG. 3. A plug combination sequence list 500 of the present embodiment is, for example, the plug combination sequence list generated based on the methods of FIG. 2 and FIG. 4 in the condition where the plug combination C1 is regarded as the initial plug combination.

In the plug combination sequence list 500, a value 510 is, for example, the count value (i.e., 3+2+3+2+3+2) correspondingly obtained after the plug combination C9 is found. Because the value 510 is not less than the total socket relationship value (i.e., 15), the second finding module 1106 can be informed that the plug combinations C1, C13, C17, C14, C10 and C9 included in the plug combination sequence list 500 can already be used to retrieve the power information sufficient for deducing the power line topology structure. Therefore, the second finding module 110_6 can provide the plug combination sequence list 500 to the user as references.

Accordingly, the user can sequentially adjust the pairing results between detecting apparatuses and the sockets to the plug combinations C1, C13, C17, C14, C10 and C9 with reference to the plug combination sequence list 500, so as to retrieve the power information sufficient for deducing the power line topology structure with the highest efficiency.

In addition, the plug combination sequence list 500 can also record the numbers of times for executing the plugging action corresponding to the plug combinations C1, C13, C17, C14, C10 and C9 (i.e., 3, 2, 4, 2, 4 and 2) respectively, and sum the numbers of times for executing the plugging action to a value 520 (i.e., 17). Accordingly, the user can be informed that the power information sufficient for deducing the power line topology structure can be retrieved by executing the plugging actions for 17 times.

Persons with ordinary skill in the art should appreciate that above mentioned values are illustrative only, instead of limiting possible embodiments of the present invention.

In other embodiments, the power line topology within the same space can be deduced by measuring the power information of the sockets within the same space.

Figure 6:
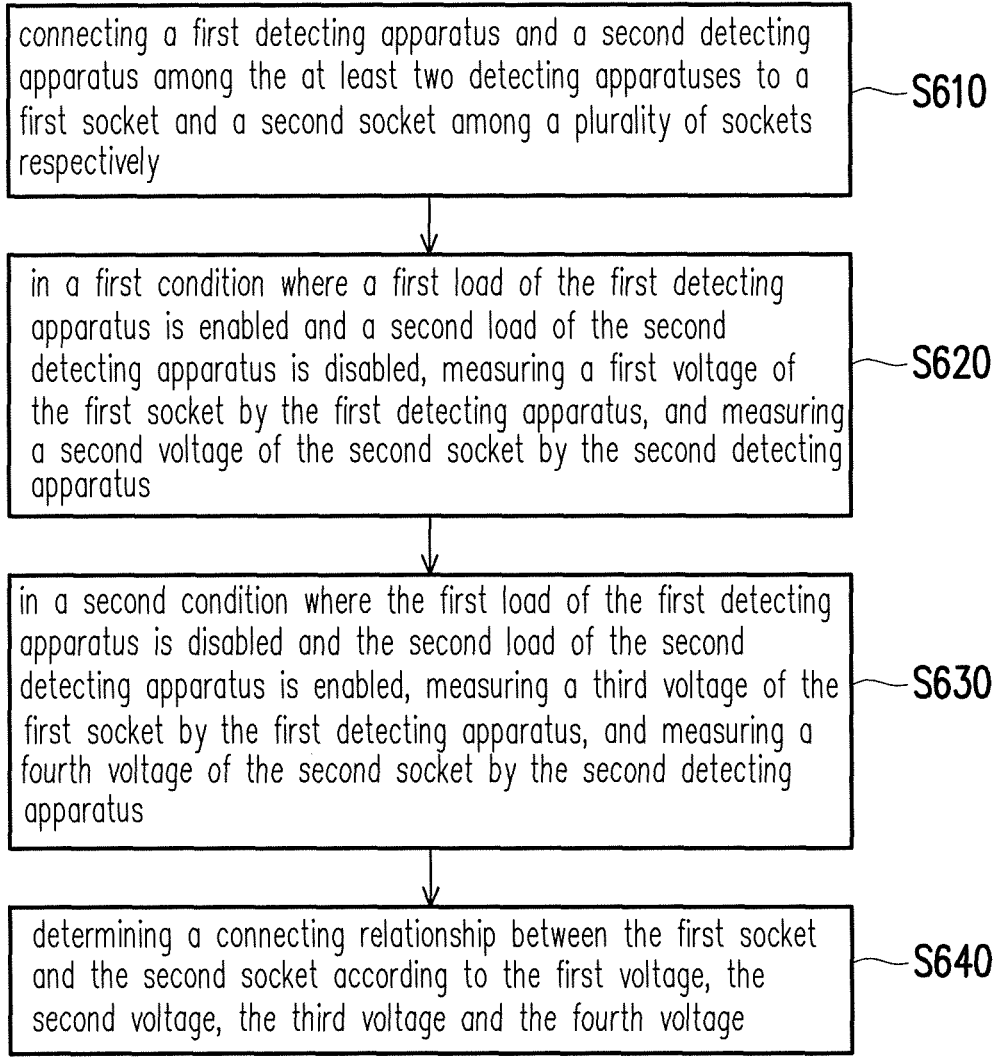
FIG. 6 is a flowchart illustrating a method for obtaining power line topology according to an embodiment of the invention.

Referring to FIG. 6, which is a flowchart illustrating a method for obtaining power line topology according to an embodiment of the invention. The method proposed by the present embodiment is adapted to the detecting apparatuses mentioned previously.

In step S610, a first detecting apparatus and a second detecting apparatus among the at least two detecting apparatuses are connected to a first socket and a second socket among a plurality of sockets respectively. In step S620, in a first condition where a first load of the first detecting apparatus is enabled and a second load of the second detecting apparatus is disabled, a first voltage of the first socket is measured by the first detecting apparatus, and a second voltage of the second socket is measured by the second detecting apparatus.

Subsequently, in step S630, in a second condition where the first load of the first detecting apparatus is disabled and the second load of the second detecting apparatus is enabled, a third voltage of the first socket is measured by the first detecting apparatus, and a fourth voltage of the second socket is measured by the second detecting apparatus.

In brief, after the first detecting apparatus and the second detecting apparatus are connected to the corresponding first socket and the corresponding second socket, the loads on the first detecting apparatus and the second detecting apparatus can be enabled in turns, and the voltage values of the first socket and the second socket in the first condition and the second condition can be measured respectively.

It should be understood that, in other embodiments, an execution sequence of step S620 can also be prior to step S610.

Thereafter, in step S640, a connecting relationship between the first socket and the second socket is determined according to the first voltage, the second voltage, the third voltage and the fourth voltage.

Figure 7:
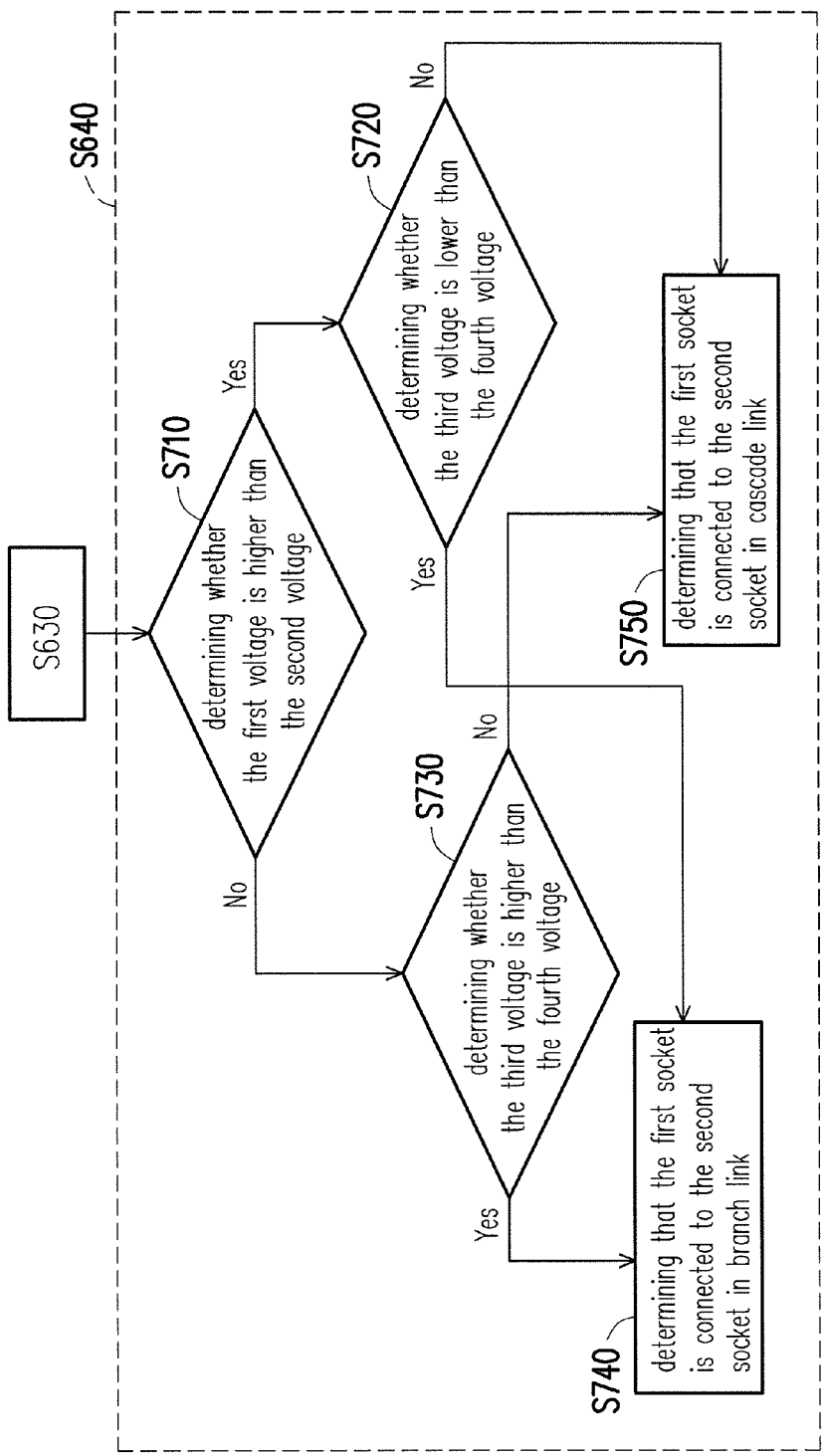
FIG. 7 is a flowchart illustrating details of determining the connecting relationship between the first socket and the second socket according to the first voltage, the second voltage, the third voltage and the fourth voltage according to the embodiment of FIG. 6.

Referring to FIG. 7, which is a flowchart illustrating details of determining the connecting relationship between the first socket and the second socket according to the first voltage, the second voltage, the third voltage and the fourth voltage according to the embodiment of FIG. 6.

In step S710, whether the first voltage is higher than the second voltage is determined. If yes, proceeding to step S720; and if no, proceeding to step S730.

In step S720, whether the third voltage is lower than the fourth voltage is determined. If yes, it is determined that the first socket is connected to the second socket in branch link in step S740; and if no, it is determined that the first socket is connected to the second socket in cascade link in step S750.

In step S730, whether the third voltage is higher than the fourth voltage is determined. If yes, it is determined that the first socket is connected to the second socket in branch link in step S740; and if no, it is determined that the first socket is connected to the second socket in cascade link in step S750.

In brief, when the voltages of the first socket measured in the first condition and the second condition are both higher than the voltages of the second socket measured in the first condition and the second condition, it indicates that the first socket is connected to the second socket in cascade link in the power line topology. In addition, when the voltages of the second socket measured in the first condition and the second condition are both higher than the voltages of the first socket measured in the first condition and the second condition, it also indicates that the first socket is connected to the second socket in cascade link in the power line topology.

On the other hand, when the first voltage is higher than the second voltages but the third voltage is lower than the fourth voltage, it indicates that the first socket is connected to the second socket in branch link in the power line topology. In addition, when the first voltage is lower than the second voltages but the third voltage is higher than the fourth voltage, it also indicates that the first socket is connected to the second socket in branch link in the power line topology.

Accordingly, a cascade relationship and a branch relationship between each of the sockets can be deduced from the power information of each of the sockets measured by the detecting apparatuses.

It should be understood that, overall measurement process of each of the detecting apparatuses can be completed more efficiently based on the plug combinations as mentioned in the previous embodiments.

In other embodiments, after the cascade relationship between each of the sockets is retrieved, a measured matrix can be established based on the cascade relationship between each of the sockets, and the measured matrix can be simplified to establish a power line topology corresponding to the sockets.

In an embodiment, the measured matrix is, for example, $$\begin{bmatrix} p_{1,1} & p_{1,2} & \cdots & p_{1,L} \\ p_{2,1} & & & \\ \vdots & & \ddots & \vdots \\ p_{L,1} & & \cdots & p_{L,L} \end{bmatrix},$$

where L is an amount of the sockets. In this measured matrix, when an $i^{th}$ socket among the sockets is connected to a $j^{th}$ socket in cascade link, $p_{i,j}$ is 1; whereas when the socket among the sockets is not connected to the $j^{th}$ socket in cascade link, $p_{i,j}$ is 0.

After the cascade relationship between each of the sockets is represented as the measured matrix, in an embodiment, a triangle cycle elimination method can be executed to simplify the measured matrix, so as to find the power line topology corresponding to the sockets.

For instance, it is assumed that the amount of the sockets in a specific space is 8, the measured matrix corresponding to these sockets deduced from the methods taught previously is:

$$\begin{bmatrix} 0 & 1 & 1 & 1 & 1 & 1 & 1 & 1 \\ 1 & 0 & 1 & 1 & 0 & 0 & 0 & 0 \\ 1 & 1 & 0 & 1 & 0 & 0 & 0 & 0 \\ 1 & 1 & 1 & 0 & 1 & 1 & 1 & 1 \\ 1 & 0 & 0 & 1 & 0 & 1 & 1 & 0 \\ 1 & 0 & 0 & 1 & 1 & 0 & 1 & 0 \\ 1 & 0 & 0 & 1 & 1 & 1 & 0 & 1 \\ 1 & 0 & 0 & 1 & 0 & 0 & 1 & 0 \end{bmatrix}.$$

Based on the measured matrix above, the corresponding simplified measured matrix is:

$$\begin{bmatrix} 0 & 0 & 0 & 1 & 0 & 0 & 0 & 0 \\ 0 & 0 & 1 & 0 & 0 & 0 & 0 & 0 \\ 0 & 1 & 0 & 1 & 0 & 0 & 0 & 0 \\ 1 & 0 & 1 & 0 & 0 & 0 & 1 & 0 \\ 0 & 0 & 0 & 0 & 0 & 1 & 0 & 0 \\ 0 & 0 & 0 & 0 & 1 & 0 & 1 & 0 \\ 0 & 0 & 0 & 1 & 0 & 1 & 0 & 1 \\ 0 & 0 & 0 & 0 & 0 & 0 & 1 & 0 \end{bmatrix}.$$

Subsequently, the power line topology corresponding to the 8 sockets can be deduced based on the simplified measured matrix.

Take a first row of the simplified measured matrix for example, because $p_{1,4}$ therein is 1, it can be deduced that the first socket is connected to the fourth socket in cascade link. Further, take a third row of the simplified measured matrix for example, because $p_{3,2}$ and $p_{3,4}$ are 1, it can be deduced that the third socket is connected to the second and fourth sockets in cascade link. The cascade relationship between the rest of the sockets can be deduced from the teachings above, which are not repeated hereinafter.

After the cascade relationship between each of the sockets is deduced, the power line topology corresponding to the simplified measured matrix can then deduced accordingly.

Figure 8:
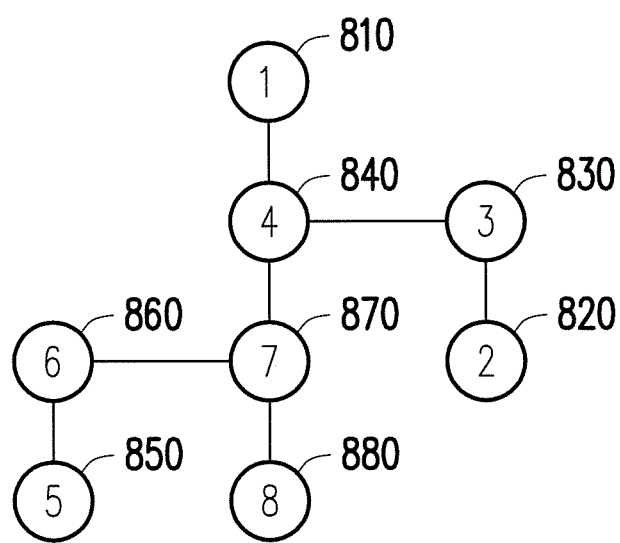
FIG. 8 illustrates a power line topology corresponding to the simplified measured matrix according to an embodiment of the invention.

Referring to FIG. 8, which illustrates a power line topology corresponding to the simplified measured matrix according to an embodiment of the invention. In the present embodiment, the power line topology includes sockets 810 to 880, which are corresponding to the first to the eighth sockets among aforesaid 8 sockets respectively. In view of FIG. 8, the cascade relationship between each of the sockets is illustrated according to the simplified measured matrix.

In summary, the method for obtaining plug combination of detecting apparatus and the electronic apparatus thereof proposed by the invention are capable of finding the candidate plug combination capable of minimizing the plug times and maximizing the socket relationships from among the reference plug combinations after the specific plug combination is determined. Further, the method is also capable of integrating the found candidate plug combinations into the plug combination sequence list, and providing the plug combination sequence list to the user, so that the user is able to complete actions for measuring the power information of the sockets with the best efficiency.

Moreover, based on the power information of the sockets measured by the detecting apparatuses according to the plug combination sequence list, the method for obtaining power line topology proposed by the invention is capable of correspondingly finding the cascade relationship between each of the sockets and thereby deducing the power line topology corresponding to the sockets.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A method for obtaining plug combination of detecting apparatus, adapted to an electronic apparatus, comprising:
   retrieving a first amount of at least one detecting apparatus and a second amount of at least one socket;
   generating a plurality of plug combinations between the at least one detecting apparatus and the at least one socket, wherein each of the plug combinations is corresponding to a pairing result of the at least one detecting apparatus and the at least one socket, and the plug combinations comprise a specific plug combination and a plurality of reference plug combinations;
   calculating a total socket relationship value according to the second amount;
   setting specific plug times and a specific socket relationship value of the specific plug combination according to the first amount;
   finding a candidate plug combination among the reference plug combinations according to the specific socket relationship value, the total socket relationship value and a distance between the specific plug combination and each of the reference plug combinations; and
   changing the specific plug combination to be the candidate plug combination in order to retrieve a power information for deducing a power line topology structure.

2. The method of claim 1, wherein the step of calculating the total socket relationship value according to the second amount comprises:
   calculating the total socket relationship value by using $C_2^N$, wherein N is the second amount.

3. The method of claim 2, wherein the step of setting the specific plug times and the specific socket relationship value of the specific plug combination according to the first amount comprises:
   setting the specific plug times to be the first amount; and
   calculating the specific socket relationship value by using $C_2^M$, wherein M is the first amount.

4. The method of claim 3, wherein the step of finding the candidate plug combination among the reference plug combinations according to the specific socket relationship value, the total socket relationship value and the distance between the specific plug combination and each of the reference plug combinations comprises:
   calculating a plurality of scores corresponding to the reference plug combinations according to the specific socket relationship value, the total socket relationship value, and the distance between the specific plug combination and each of the reference plug combinations;
   finding a highest score among the scores; and
   defining the reference plug combination corresponding to the highest score to be the candidate plug combination.

5. The method of claim 4, wherein the distance is a Hamming distance, a $k^{th}$ reference plug combination among the reference plug combinations is corresponding to a $k^{th}$ score among the scores, and the step of calculating the scores corresponding to the reference plug combinations comprises:

representing the $k^{th}$ score as:

$$Score_k = \frac{R_k}{R_{total}} + \frac{1}{NumBit(x_n \oplus x_k)}$$

wherein $Score_k$ is the $k^{th}$ score, $R_k$ is a socket relationship value between the specific plug combination and the $k^{th}$ reference plug combination, $R_{total}$ is the total socket relationship value, $x_n$ is the specific plug combination, $x_k$ is the $k^{th}$ reference plug combination, NumBit $(x_n \oplus x_k)$ is the Hamming distance between $x_n$ and $x_k$, and $\oplus$ is an exclusive OR operator.

6. The method of claim 5, wherein after the step of finding the candidate plug combination among the reference plug combinations according to the specific socket relationship value, the total socket relationship value and the distance between the specific plug combination and each of the reference plug combinations, the method further comprises:
adding the specific plug combination to a plug combination sequence list;
accumulating the specific socket relationship value to a count value;
eliminating the candidate plug combination from the reference plug combinations when the count value is less than the total socket relationship value;
updating the specific socket relationship value according to the socket relationship value between the candidate plug combination and the specific plug combination, and setting the candidate plug combination to be the specific plug combination;
finding again the candidate plug combination among the reference plug combinations according to the specific socket relationship value, the total socket relationship value and the distance between the specific plug combination and each of the reference plug combinations.

7. The method of claim 6, further comprising:
outputting the plug combination sequence list when the count value is not less than the total socket relationship value.

8. An electronic apparatus, comprising:
a storage unit, storing a plurality of modules; and
a processing unit, connected to the storage unit, accessing and executing the modules stored in the storage unit, and the modules comprise:
a retrieving module, retrieving a first amount of at least one detecting apparatus and a second amount of at least one socket;
a generating module, generating a plurality of plug combinations between the at least one detecting apparatus and the at least one socket, wherein each of the plug combinations is corresponding to a pairing result of the at least one detecting apparatus and the at least one socket, and the plug combinations comprise a specific plug combination and a plurality of reference plug combinations;
a calculating module, calculating a total socket relationship value according to the second amount;
a setting module, setting specific plug times and a specific socket relationship value of the specific plug combination according to the first amount; and
a first finding module, finding a candidate plug combination among the reference plug combinations according to the specific socket relationship value, the total socket relationship value and a distance between the specific plug combination and each of the reference plug combinations.

9. The electronic apparatus of claim 8, wherein the calculating module calculates the total socket relationship value by using $C_2^N$, wherein N is the second amount.

10. The electronic apparatus of claim 8, wherein the setting module is configured to
set the specific plug times to be the first amount; and
calculate the specific socket relationship value by using $C_2^M$, wherein M is the first amount.

11. The electronic apparatus of claim 8, wherein the first finding module is configured to
calculate a plurality of scores corresponding to the reference plug combinations;
find a highest score among the scores; and
define the reference plug combination corresponding to the highest score to be the candidate plug combination.

12. The electronic apparatus of claim 11, wherein the distance is a Hamming distance, and the first finding module represents the $k^{th}$ score as:

$$Score_k = \frac{R_k}{R_{total}} + \frac{1}{NumBit(x_n \oplus x_k)}$$

wherein $Score_k$ is the $k^{th}$ score, $R_k$ is a socket relationship value between the specific plug combination and the $k^{th}$ reference plug combination, $R_{total}$ is the total socket relationship value, $x_n$ is the specific plug combination, $x_k$ is the $k^{th}$ reference plug combination, NumBit $(x_n \oplus x_k)$ is the Hamming distance between $x_n$ and $x_k$, and $\oplus$ is an exclusive OR operator.

13. The electronic apparatus of claim 12, wherein the modules further comprise a second finding module configured to
add the specific plug combination to a plug combination sequence list;
accumulate the specific socket relationship value to a count value;
eliminate the candidate plug combination from the reference plug combinations when the count value is less than the total socket relationship value;
update the specific socket relationship value according to the socket relationship value between the candidate plug combination and the specific plug combination, and set the candidate plug combination to be the specific plug combination; and
find again the candidate plug combination among the reference plug combinations according to the specific socket relationship value, the total socket relationship value and the distance between the specific plug combination and each of the reference plug combinations.

14. The electronic apparatus of claim 13, wherein the second finding module outputs the plug combination sequence list when the count value is not less than the total socket relationship value.

15. A method for obtaining power line topology, adapted to at least two detecting apparatuses, and comprising:
connecting a first detecting apparatus and a second detecting apparatus among the at least two detecting apparatuses to a first socket and a second socket among a plurality of sockets respectively, wherein the sockets belong to the same space;
in a first condition where a first load of the first detecting apparatus is enabled and a second load of the second detecting apparatus is disabled, measuring a first voltage of the first socket by the first detecting apparatus, and measuring a second voltage of the second socket by the second detecting apparatus;

in a second condition where the first load of the first detecting apparatus is disabled and the second load of the second detecting apparatus is enabled, measuring a third voltage of the first socket by the first detecting apparatus, and measuring a fourth voltage of the second socket by the second detecting apparatus;

determining a connecting relationship between the first socket and the second socket according to the first voltage, the second voltage, the third voltage and the fourth voltage, which comprises:

deducing a cascade relationship between each of the sockets; and establishing a power line topology corresponding to the sockets based on the cascade relationship between each of the sockets.

16. The method of claim 15, wherein the step of determining the connecting relationship between the first socket and the second socket according to the first voltage, the second voltage, the third voltage and the fourth voltage comprises:

determining whether the first voltage is higher than the second voltage;

if the first voltage is not higher than the second voltage, determining whether the third voltage is higher than the fourth voltage;

if yes, determining that the first socket is connected to the second socket in branch link;

if no, determining that the first socket is connected to the second socket in cascade link;

if the first voltage is higher than the second voltage, determining whether the third voltage is lower than the fourth voltage;

if yes, determining that the first socket is connected to the second socket in branch link;

if no, determining that the first socket is connected to the second socket in cascade link.

17. The method of claim 15, after the step of deducing the cascade relationship between each of the sockets, the method further comprises: establishing a measured matrix based on the cascade relationship between each of the sockets, and simplifying the measured matrix to establish the power line topology corresponding to the sockets.

18. The method of claim 17, wherein the measured matrix is:

$$\begin{bmatrix} p_{1,1} & p_{1,2} & \cdots & p_{1,L} \\ p_{2,1} & & & \\ \vdots & & \ddots & \vdots \\ p_{L,1} & & \cdots & p_{L,L} \end{bmatrix}$$

wherein L is an amount of the sockets, and $p_{i,j}$ is 1 when an $i^{th}$ socket among the sockets is connected to a $j^{th}$ socket in cascade link, $p_{i,j}$ is 0 when the $i^{th}$ socket among the sockets is not connected to the $j^{th}$ socket in cascade link.

19. The method of claim 17, wherein the step of simplifying the measured matrix to establish the power line topology corresponding to the sockets comprises:

executing a triangle cycle elimination method to simplify the measured matrix.

* * * * *